United States Patent [19]

Koble, Jr. et al.

[11] Patent Number: 5,618,351
[45] Date of Patent: Apr. 8, 1997

[54] THERMAL PROCESSING APPARATUS AND PROCESS

[75] Inventors: Terry A. Koble, Jr., Lake Forest, Calif.; Anthony Dip, Austin, Tex.; Erik H. Engdahl, Anaheim, Calif.; Ian R. Oliver, San Diego, Calif.; Christopher T. Ratliff, Corona del Mar, Calif.

[73] Assignee: Silicon Valley Group, Inc., San Jose, Calif.

[21] Appl. No.: 563,875

[22] Filed: Nov. 28, 1995

Related U.S. Application Data

[63] Continuation-in-part of Ser. No. 399,108, Mar. 3, 1995.

[51] Int. Cl.⁶ .................................................. C23C 16/00
[52] U.S. Cl. ........................ 118/728; 118/729; 156/345; 432/5; 432/6; 432/253; 432/258
[58] Field of Search .................................. 118/728, 729; 156/345; 432/253, 258, 5, 6

[56] References Cited

U.S. PATENT DOCUMENTS

| | | | |
|---|---|---|---|
| 5,320,680 | 6/1994 | Learn et al. | 118/725 |
| 5,443,649 | 8/1995 | Sibley | 118/728 |

FOREIGN PATENT DOCUMENTS

| | | |
|---|---|---|
| 4-184923 | 7/1992 | Japan . |
| 5-006894 | 1/1993 | Japan . |

*Primary Examiner*—Richard Bueker
*Attorney, Agent, or Firm*—William B. Walker

[57] ABSTRACT

Thermal treatment boat comprising a cylinder having a central axis and a plurality of band slots having opposed upper and lower surfaces in planes perpendicular to said central axis and spaced at predetermined locations along said central axis. At least one slot in each set extends around at least 180° and less than of the full circumference of said cylinder. Pairs of adjacent band slots define an annular band therebetween. The height of each slot being from about 3.8 to 12.7 mm. Each of the bands having a height, $\text{Height}_{Band}$, in mm, according to the equation:

$$\text{Height}_{Band} = \frac{\text{ColumnHeight} - \Sigma \text{BandSlotHeight}}{\text{NumberBands}}$$

wherein $\text{Height}_{Band}$ is always $\leq$ wafer thickness; ColumnHeight is the total height of the cylinder, mm; BandSlotHeight is the height of the slot, mm; and NumberBands is the total number of bands in the treatment boat. The cylinder can include a wafer loading effector slot therethrough in a plane of the central axis extending along the length of the cylinder. Each band preferably includes wafer support means for supporting a wafer therein. The wafer support means preferably includes at least three inwardly extending projections. The spacing between the wafer edge and the cylinder wall is within the range of from about 1.5 to 6.3 mm. In the optimum process, the heat provided by the heater is sufficient to raise the temperature of the wafers from 21° C. up to 1100° C. at a rate of from 50° C./min to 100° C./min without causing mechanical damage from thermal stresses to the wafers.

20 Claims, 5 Drawing Sheets

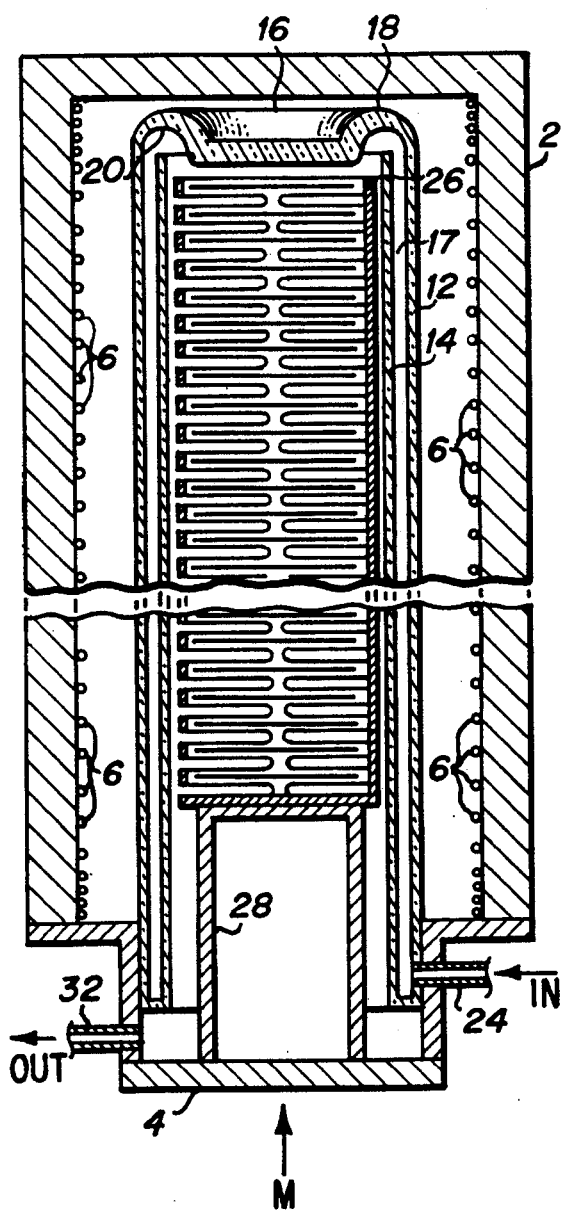
Fig_1
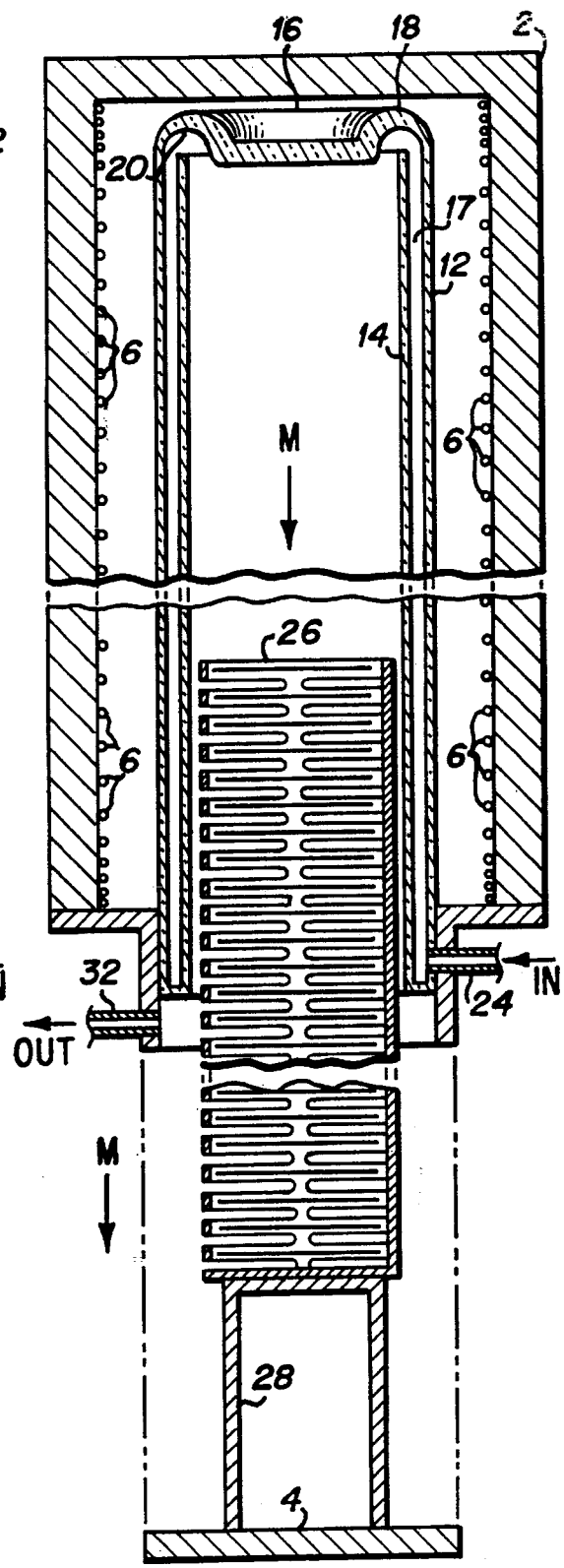
Fig_2

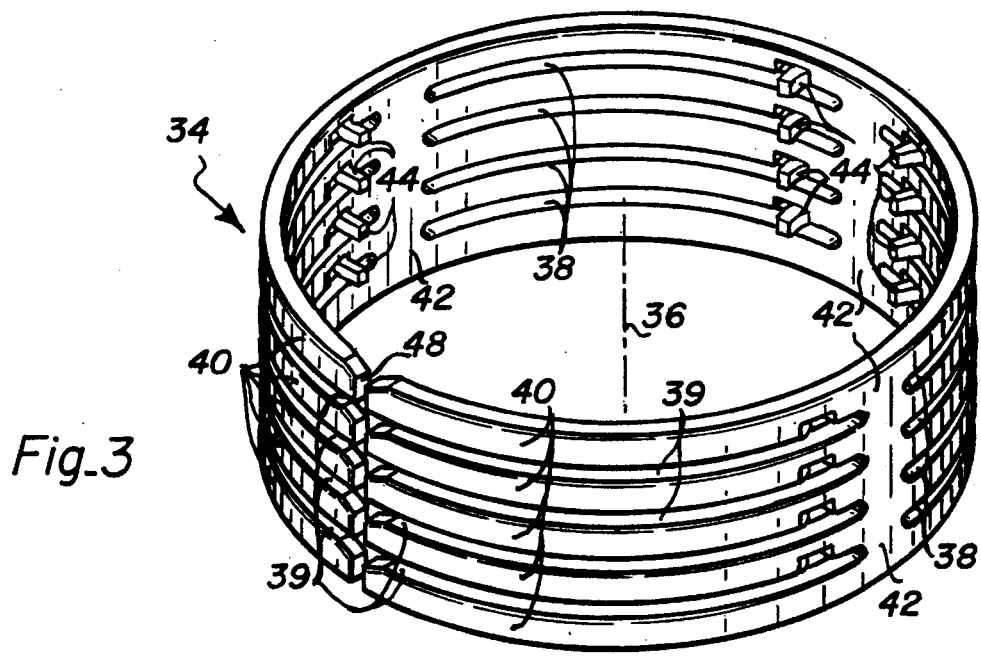
Fig_3
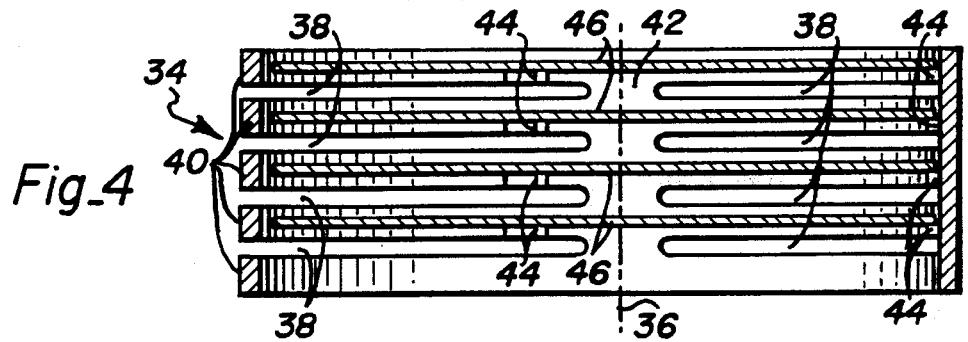
Fig_4
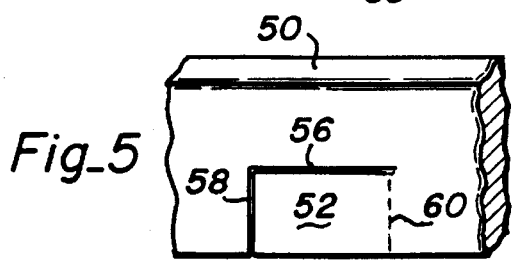
Fig_5
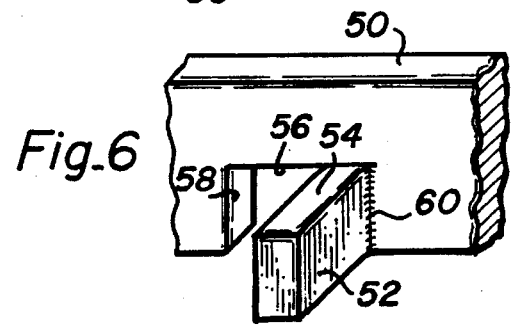
Fig_6
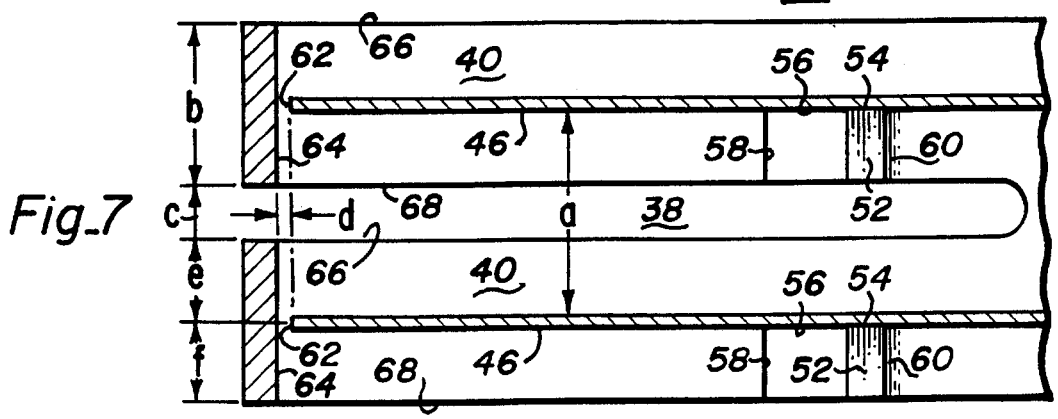
Fig_7

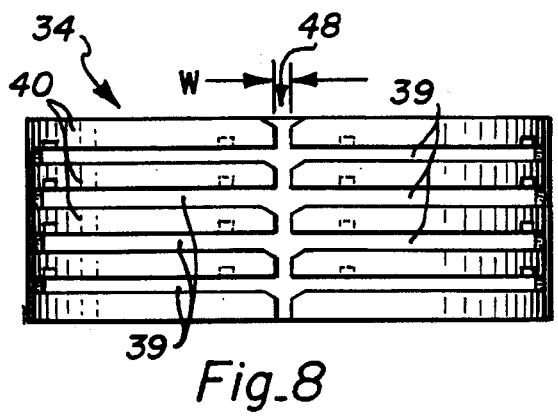
Fig_8
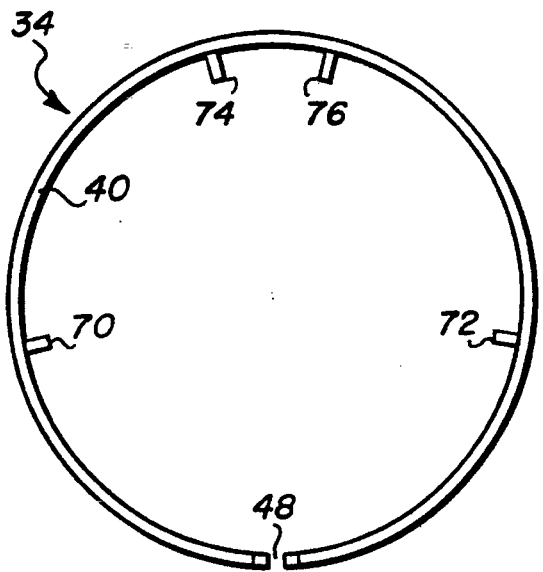
Fig_9
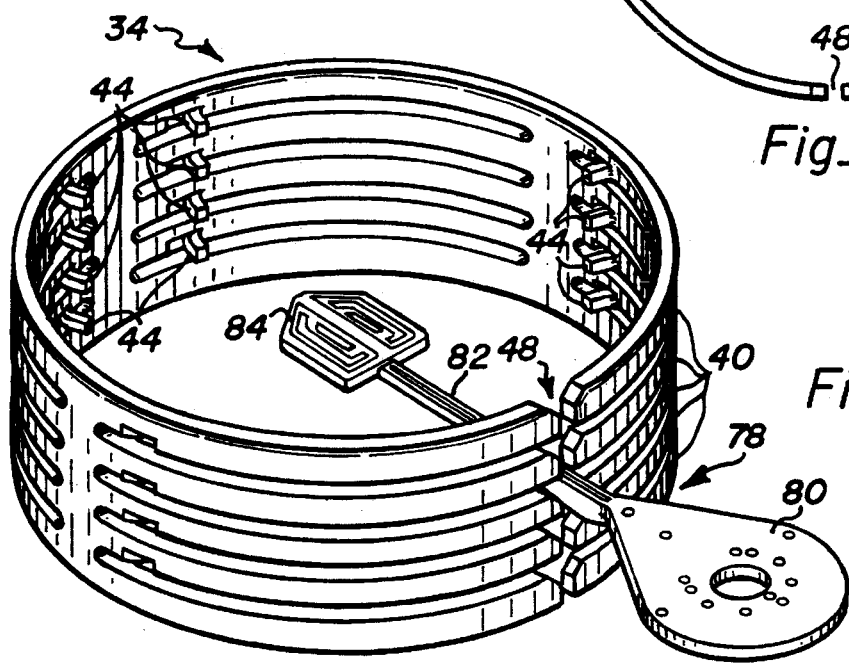
Fig_10
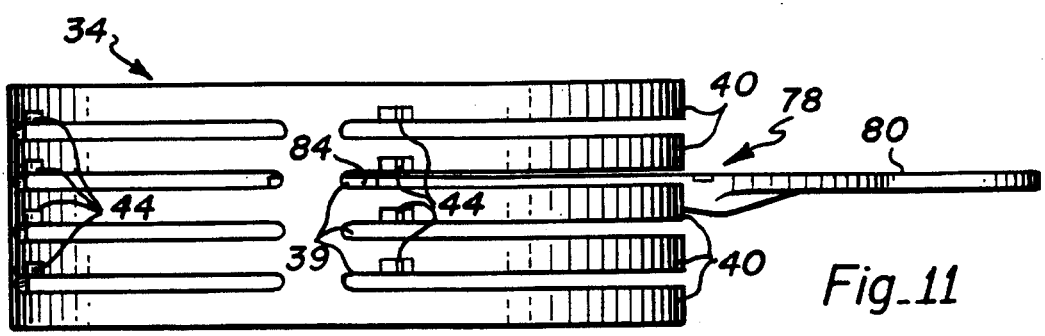
Fig_11

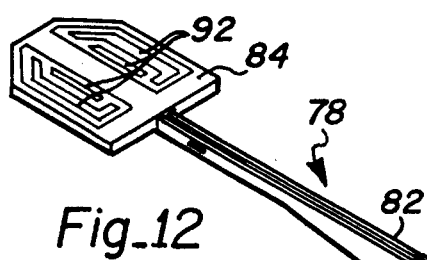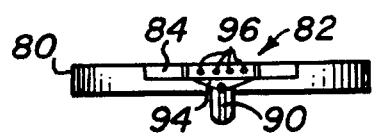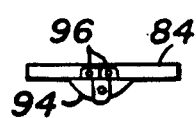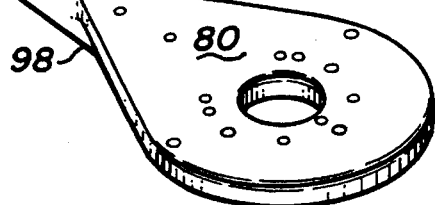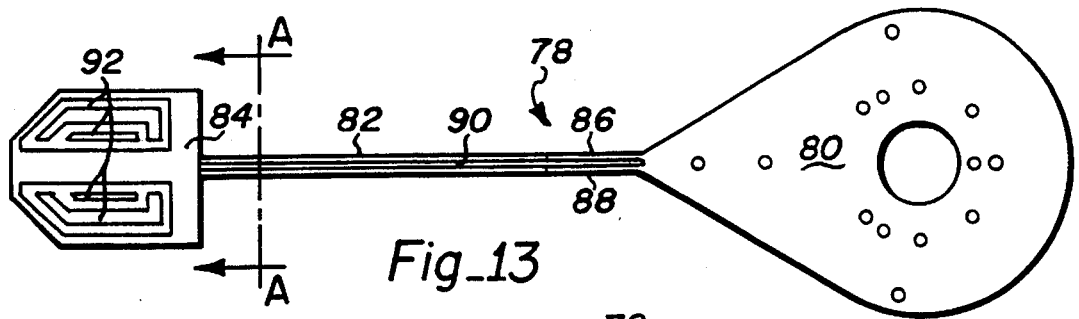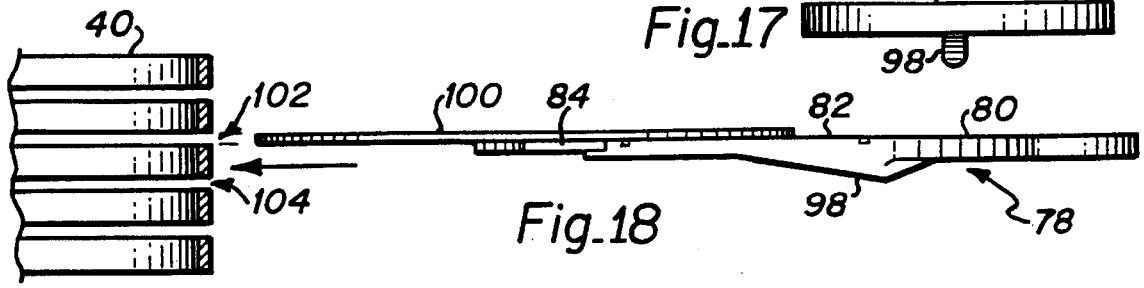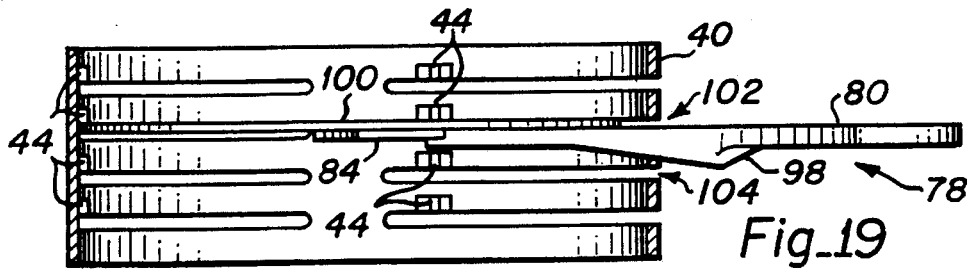

THERMAL PROCESSING APPARATUS AND PROCESS

RELATIONSHIP TO COPENDING APPLICATION

This application is a continuation-in-part of copending application Ser. No. 08/399,108, filed Mar. 3, 1995.

FIELD OF THE INVENTION

This invention relates to an improved thermal processing apparatus and process for heat treatment of semiconductor and glass wafer substrate and the like.

BACKGROUND OF THE INVENTION

Heat treatment devices have been used to form diffusion layers or form silicon oxide or nitride films in the manufacture of electronic devices on semiconductor or glass substrates. These substrates are typically thin wafers made of silicon or other semiconductor material, and the description of the device hereinafter will be provided in reference to wafer substrates, it being understood that the apparatus is equally suitable for treating any thin glass or semiconductor sheets, and treatment of all of these materials are considered to be within the scope of this invention.

These devices provide the desired heat treatment by heating the wafers in a reactor or heating chamber while introducing inert or reactive gases into the chamber. These heating chambers are surrounded by heating elements enclosed within an insulated shell. In order to treat large numbers of wafers in a single heat treatment operation, it is conventional to support the wafers, one above the other in a parallel orientation, in a wafer boat. This combination is referred to hereinafter as a wafer stack.

The heat treatment apparatus and process must accomplish the heat treatment without damaging the wafers such as by causing slips or warping, for example. Therefore, severe temperature differences across the width of the substrates must be avoided. On the other hand, the heating process should be as brief as necessary to accomplish the desired treatment.

The transfer temperature of the wafers to and from the furnace or reactor is from 500° to 600° C. The heating cycle is initiated after the wafer stack, at the transfer temperature, is positioned in the heating chamber, and ambient gases have been replaced by suitable protective gases. The usual wafer spacing in the wafer stack is approximately 4 mm per wafer. Heat radiating from the heating elements surrounding the heating chamber impinge primarily on the outer edges of the wafers. Increasing the heating and cooling rates causes an increase in temperature differences between the outer edge and center of the wafers, and an excessive increase in heating and cooling rates causes thermal distortions, leading to warping, crystal defects and slips in the wafers. The maximum heating rate in such configurations is limited to 10°–12° C./min, and the maximum cooling rate is about 5° C./min. This extends the time of each thermal treatment cycle and severely limits the production capacity or throughput of each thermal treatment device.

Japanese patent application publication Hei 4-184923 to Nishimura et al (Jul. 1, 1992) describes a heat treatment apparatus designed to reduce the heating time. In this apparatus, the wafers are supported in a circular jig having a heat capacity graduated to be maximum at the periphery of the wafers. The jigs comprise ring-shaped trays which hold the wafers around their peripheries, the thickness of the heat capacity of the tray being constant or increasing from the inside to the outside. The trays can be formed from several materials in which the specific heat is greater on the outside than the inside. The Nishimura et al system greatly increases the heat capacity of the components in the heating chamber, requiring the provision of greater heat energy for the heating phase and greater heat removal during the cooling phase of the cycle. The minimum times of both the heating and cooling phases are extended by these high heat capacity components.

OBJECTS AND SUMMARY OF THE INVENTION

It is an object of this invention to provide a rapid heating and cooling thermal treatment apparatus and process with heating rates of from 50° to 100° C./min and cooling rates up to 50° C./min.

It is another object of this invention to provide a thermal treatment apparatus and method which greatly reduces the temperature differences across the width and surfaces of a stack of wafers being processed, thereby greatly reducing or eliminating thermal stress damage to the wafers being treated.

In summary, the thermal treatment boat of this invention comprises a cylinder having a central axis and a plurality of sets of one or more slots (band slots) having opposed upper and lower surfaces in planes perpendicular to said central axis and spaced at predetermined locations along the central axis. At least one band in each set extends around about at least fifty percent or 180° and less than the entire circumference of said cylinder. Adjacent band slots define an annular band between them. The height of each slot is from about 3.8 to 12.7. Each of the bands has a height, Height$_{Band}$, in mm, according to the equation:

$$\text{Height}_{Band} = \frac{\text{ColumnHeight} - \Sigma \text{BandSlotHeight}}{\text{NumberBands}}$$

wherein Height$_{Band}$ is always $\geq$ wafer thickness; ColumnHeight is the total height of the cylinder, mm; BandSlotHeight is the height of the slot, mm; and NumberBands is the total number of bands in the treatment boat. A plurality of slots can be present in each plane.

In one embodiment, the cylinder includes a effector slot therethrough in a plane of the central axis extending along the length of the cylinder, the wafer loading or effector slot preferably having a width of from 5 to 20 mm. The NumberBands can be from about 12 to about 100, provided that Height$_{Band}$ is at least equal to or greater than the wafer thickness.

Each band preferably includes wafer support means for supporting a wafer therein at a position which is substantially centered between the upper edge surface and said lower edge surface thereof. The wafer support means preferably includes at least three inwardly extending projections, preferably having coplanar upper edge surfaces. The projection are preferably inwardly extending strips, the upper edge surface of each strip being formed by a cut through the respective band in a plane perpendicular to the cylinder axis. The strips can be a preferred inwardly depressed strip formed by a single cut with both ends of the strip joined to the band and integral therewith. Alternatively, the strips can be polygonal tabs, each tab being formed by a plurality of tab-defining, connected cuts extending through the cylinder wall. Each set of connected cuts can extend from a hinge line approximately parallel to said central axis. The uppermost cut is in a plane perpendicular to said central axis, and the tab is bent inwardly about the hinge line to form an inwardly extending projection.

Each band has an inner surface, and each band and wafer support means defines a wafer occupancy zone corresponding to the volume to be occupied by a wafer for which it is sized, the radial clearance between the outer edge of the wafer occupancy zone and the inner surface of the respective band being within the range of from about 1.5 to 6.3 mm. Preferably, the NumberBands is selected for the wafer size. When the outer diameter of the wafer occupancy zone is about 150 mm, and the NumberBands can be from about 25 to 100. When the outer diameter of the wafer occupancy zone is about 200 mm, and the NumberBands can be from about 25 to 75. When the outer diameter of the wafer occupancy zone is about 300 mm, and the NumberBands can from about 12 to 48.

The heat shields are selected from material such as metal, crystal, ceramic, graphite or a composite thereof. Components made of as quartz, polysilicon, silicon carbide, alumina or silica are preferred. Quartz forms with different opacities such as sandblasted, opaque and clear fused quartz can be used. The heat shield material must have dimensional and structural stability at the maximum heat treatment temperatures, the purity and inertness to prevent contamination of the materials being processed, and the opacity to shield the wafer surface from a portion of the infrared radiant heat emitted by the heat sources surrounding the wafer boat.

In summary, the process of this invention heat treats multiple wafers having a common vertical axis and positioned in a mutually parallel orientation in a heating zone surrounded by a heater emitting radiant heat. The process comprises shielding the outer portions of each wafer from radiant heat emitted by the heater with a annular heat band positioned between the outer edge of each wafer and the heater. Each annular heat band is one of a plurality of heat bands formed in a cylinder having a central axis and a plurality of sets of one or more slots (band slots) having opposed upper and lower surfaces in planes perpendicular to said central axis and spaced at predetermined locations along the central axis. At least one band slot in each set extends around about at least fifty percent or 180° and less than the entire circumference of said cylinder. Adjacent band slots define an annular band between them. The height of each slot is from about 3.8 to 12.7 mm. Each of the bands has a height, Height$_{Band}$, in mm, according to the equation:

$$\text{Height}_{Band} = \frac{\text{ColumnHeight} - \Sigma\text{BandSlotHeight}}{\text{NumberBands}}$$

wherein Height$_{Band}$ is always ≧ wafer thickness; ColumnHeight is the total height of the cylinder, mm; BandSlotHeight is the height of the slot, mm; and NumberBands is the total number of bands in the treatment boat. In the preferred process, the distance between the edge of each wafer and the band by which it is shielded is from 1.5 to 6.3 mm.

In the optimum process, the heat provided by the heater is sufficient to raise the temperature of the wafers from 21° C. up to 1100° C. at a rate of from 50° C./min to 100° C./min without causing mechanical damage due to induced stresses in the wafers.

The unitary wafer effector of this invention has an connector means on the proximal end for attachment to a robot arm, a wafer support means on the distal end for supporting wafers for loading and unloading, and an arm connecting the connector and the wafer support means. The arm comprises two spaced apart plates. The wafer support means includes raised areas for wafer contact and passageways therethrough. The raised areas and passageways comprise means for reducing heat passage from the wafer support means to the connector means, wafer attachment vacuum and fiber optic vision facilities.

BRIEF DESCRIPTION OF THE DRAWINGS

FIG. 1 is a cross-sectional schematic view of a representative thermal treatment apparatus of this invention with a wafer stack placed in the heating zone.

FIG. 2 is a cross-sectional schematic view of the thermal treatment apparatus shown in FIG. 1 with the wafer stack support in a partially lowered position.

FIG. 3 is an isometric view of a portion of the unitary wafer boat of this invention.

FIG. 4 is a cross-sectional side view of the wafer boat of FIG. 3 showing the wafer support tabs loaded with wafers.

FIG. 5 is a fragmentary portion of a annular band showing tab cuts therein.

FIG. 6 is a fragmentary portion of the annular band of FIG. 5 after the tab is bent inwardly to a wafer support position.

FIG. 7 is a fragmentary cross-sectional view of the wafer boat of FIG. 4.

FIG. 8 is a front view of the wafer boat of FIG. 3 showing the wafer loading effector slot.

FIG. 9 is a top view of the wafer boat of FIG. 3 showing the relative placement of the effector loading slot and the wafer support tabs.

FIG. 10 is an isometric view of the wafer boat of FIG. 3 in combination with a wafer loading effector.

FIG. 11 is a side view of the wafer boat of FIG. 10 showing the wafer loading effector in side view.

FIG. 12 is an isometric view of the wafer loading effector.

FIG. 13 is a top view of the wafer loading effector of FIG. 12.

FIG. 14 is a cross-sectional view of the wafer loading effector of FIG. 13, taken along the line A—A.

FIG. 15 is an end view of the wafer loading effector of FIG. 12 as seen from the wafer support end of the device.

FIG. 16 is a side view of the wafer loading effector of FIG. 12.

FIG. 17 is an end view of the wafer loading effector as seen from the connector end.

FIG. 18 is a side view of a wafer loaded effector approaching a wafer boat prior to unloading the wafer.

FIG. 19 is a side view of the wafer loaded effector in position in a wafer boat prior to depositing the wafer.

DETAILED DESCRIPTION OF THE INVENTION

Figure 20:
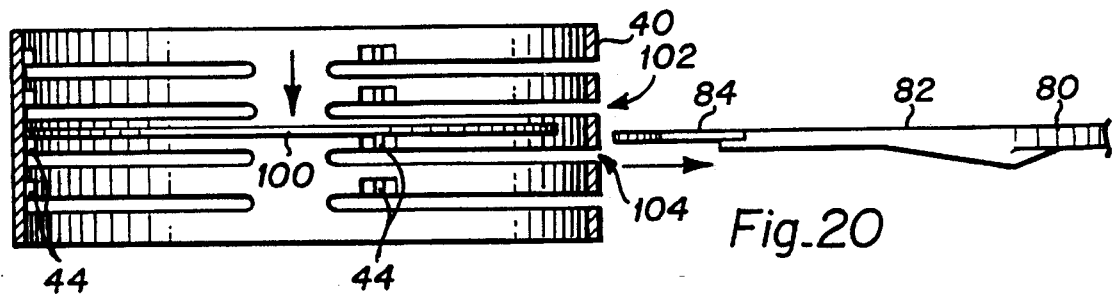
FIG. 20 is a side view of the effector being withdrawn after the wafer is deposited in the wafer boat.

The apparatus of this invention is used for thermal treatment of thin wafers or glass substrates, primarily in the preparation of semiconductor devices for the electronics industry. This apparatus processes the wafers or substrates, supported in a position where the wafers have a common, vertical central axis and a parallel, spaced-apart orientation. The wafers are positioned in a wafer boat or similar rack to provide a greatly reduced cycle process time without causing mechanical damage from thermal stresses to the wafers.

FIG. 1 is a cross-sectional schematic view of a representative thermal treatment apparatus of this invention with a wafer stack placed in the heating zone, and FIG. 2 is a cross-sectional schematic view of the thermal treatment apparatus with the wafer stack support in a partially lowered position. This apparatus is a reactor or furnace having an outer insulated housing or casing 2 with an axially moveable base support platform 4. The inner surface of the reactor casing is lined with resistance heating elements 6 or equivalent heat sources distributed to provide a uniform isothermal temperature within the chamber.

The support platform 4 is raised and lowered by a conventional system such as shown in U.S. Pat. No. 5,320,680, to load the wafer boat in the furnace before heat treatment and to remove it therefrom after the treatment cycle is completed.

The gas flow through the reactor is controlled in part by the quartz cylinders or tubes 12 and 14. The space 7 between the outer cylinder 12 and the inner cylinder 4 is a preheat zone through which rising gases are passed to raise their temperature to the desired treatment temperature or higher. The upper end of the treatment chamber includes a central disk 16. The curved tube flange 18 extends from the periphery of the disk 16 to the upper end of the outer tube 12. The inner surface 20 of the tube flange 18 is preferably curved, for example in the shape of a section of a torus, to maintain laminar flow patterns of gases being directed thereby and to strengthen the support of the head disk 16 under a vacuum load.

The lower end of the assembly has a gas inlet conduit 24. The reaction heating chamber is defined by the inner cylinder 14. A wafer boat 26 supported on a pedestal 28 is positioned in the heating chamber during the treatment cycle, the inner cylinder 14 defining the gas flow passageway past the wafer boat. The lower portion of the tube assembly has a gas outlet conduit 32. The pedestal 28 can include heating elements (not shown) to reduce heat loss through the lower portion of the chamber.

FIG. 3 is an isometric view of a portion of the unitary wafer boat of this invention, and FIG. 4 is a cross-sectional side view of the wafer boat of FIG. 3 showing the wafer support tabs loaded with wafers. The wafer boat 34 comprises a cylinder having a central axis 36 and a plurality of slot planes 38 and 39 perpendicular to and spaced along said central axis. At least one slot extends around at least 50 percent or 180° and less than the entire circumference of said cylinder. Slots in adjacent planes define a annular band 40 therebetween. The vertical portions through which the slots do not extend function as support columns 42. The annular bands 40 have integral wafer support tabs 44 which support wafers 46 (FIG. 4) in a precise, parallel orientation. A wafer effector slot 48 extends through the cylinder wall in a direction generally parallel to the axis 36, at approximately the mid-portion of slots 39 (see also FIG. 8).

FIG. 5 is a fragmentary portion of a annular band 50 showing tab cuts therein, and FIG. 6 is a fragmentary portion of the annular band of FIG. 5 after the tab 52 is bent inwardly to a wafer support position. The wafer support means preferably includes at least three inwardly extending tab projections. The inwardly extending projections can be polygonal tabs having a coplanar upper edge surface 54. Each tab can be formed by making a plurality of tab defining, connected cuts 56 and 58 extending through the cylinder wall 50, each set of connected cuts extending from a hinge line 60 which is approximately parallel to the central axis 36 (FIG. 4). The uppermost cut 56 is in a plane perpendicular to said central axis 36, and the tab 52 is bent inwardly about the hinge line 60 to form the inwardly extending projection 44 (FIG. 3) Optimally, each tab is rectangular.

FIG. 7 is a fragmentary cross-sectional view of the wafer boat of FIG. 4 showing the relative dimensional parameters of the boat. The height of the heat shield bands and the distance between the edges of adjacent shields are critically important aspects of this invention. They establish the size and positions of the wafer surfaces which are shielded from direct exposure to the heat sources and those further areas which are shielded from the heat sources which are nearest the wafer. They thus establish a heat conduction pattern in the wafers which are from the inner wafer areas to the outer edges and center. We have discovered that with this heating pattern, temperature differences between the center and outer edges of the wafer are greatly reduced even during rapid heating, greatly reducing the cycle time required to eliminate destructive thermal damage to the wafers.

The distance between the upper surfaces of the wafers (wafer spacing or pitch) "a" is the distance determined by the spacing between the upper surfaces 54 of the wafer support tabs 44. The height of the heat shield band "b" is determined by the spacing between the slots 38 and is limited by the height of the wafer boat, the number of bands in each boat and the height of the slots. The distance between the opposing heat shield bands 40, that is, the height of the slot 38 in a direction parallel to the central axis of the cylinder, is represented by "c". The spacing between the edge 62 of the wafer 46 and the inside surface 64 of the shield band 40 is represented by "d". The wafer 46 is preferably positioned in the center of the respective shield band, and thus the distance between the center plane of the wafer and the upper band surface 66, "e", and the distance between the lower surface of the band 68 and the center plane of the wafer "f" are preferably about the same.

The height "c" of each band slot 38 is from about 3.8 to 12.7 mm. Each of the bands has a height, "b" or $\text{Height}_{Band}$, in mm, according to the equation:

$$\text{Height}_{Band} = \frac{\text{ColumnHeight} - \Sigma \text{BandSlotHeight}}{\text{NumberBands}}$$

wherein $\text{Height}_{Band}$ is always ≥ wafer thickness; ColumnHeight is the total height of the cylinder, mm; BandSlotHeight is the height of the slot, mm; and NumberBands is the total number of bands in the treatment boat.

Each band has an inner surface, and each band and wafer support means defines a wafer occupancy zone corresponding to the volume to be occupied by a wafer for which it is sized, the radial clearance, "d" between the outer edge of the wafer occupancy zone and the inner surface of the respective band being within the range of from about 1.5 to 6.3 mm. Preferably, the NumberBands is selected for the wafer size. The NumberBands can be from about 12 to about 100, provided that $\text{Height}_{Band}$ is at least greater than or equal to the wafer thickness. When the outer diameter of the wafer occupancy zone is about 150 mm, the NumberBands is optimally from about 25 to 100. When the outer diameter of the wafer occupancy zone is about 200 mm, the NumberBands is optimally from about 25 to 75. When the outer diameter of the wafer occupancy zone is about 300 mm, the NumberBands is optimally from about 12 to 48. Optimally, the height of each band and the band spacing between adjacent bands are substantially the same.

Values for these critical parameters are shown in the following Tables 1, 2, 3, 4, 5 and 6.

TABLE 1

| Family 150 mm | Min., mm | Max., mm | Min., mm | Max., mm |
|---|---|---|---|---|
| Slot Width w | 5.1 | 19.1 | 5.1 | 19.1 |
| Radial Clearance d | 1.5 | 6.4 | 1.5 | 6.4 |
| Tube Int. $\phi$ $\phi_{ID} = \phi_w + 2d$ | 153.0 | 162.7 | 153.0 | 162.7 |
| Band Height b = a · c | 26.7 | 27.9 | 11.4 | 7.6 |
| Band Spacing c | 3.8 | 12.7 | 3.8 | 12.7 |
| Pitch a = l/n = (Flat zone)/ (No. wafers) | 30.5 | 40.6 | 15.2 | 20.3 |
| Flat Zone l | 762 | 1016 | 762 | 1016 |
| No. of Wafers n | 25 | 25 | 50 | 50 |
| Wafer $\phi$ ($\phi_w$) | 150 | 150 | 150 | 150 |

TABLE 2

| Family 150 mm | Min., mm | Max., mm | Min., mm | Max., mm |
|---|---|---|---|---|
| Slot Width w | 5.1 | 19.1 | 5.1 | 19.1 |
| Radial Clearance d | 1.5 | 6.4 | 1.5 | 6.4 |
| Tube Int. $\phi$ $\phi_{ID} = \phi_w + 2d$ | 153.0 | 162.7 | 153.0 | 162.7 |
| Band Height b = a · c | 6.4 | 0.8 | 3.8 | ≧ wafer thickness |
| Band Spacing c | 3.8 | 12.7 | 3.8 | 12.7 |
| Pitch a = l/n | 10.2 | 13.5 | 7.6 | 10.2 |
| Flat Zone l | 762 | 1016 | 762 | 1016 |
| No. of Wafers n | 75 | 75 | 100 | 100 |
| Wafer $\phi$ ($\phi_w$) | 150 | 150 | 150 | 150 |

TABLE 3

| Family 200 mm | Min., mm | Max., mm | Min., mm | Max., mm |
|---|---|---|---|---|
| Slot Width w | 5.1 | 19.1 | 5.1 | 19.1 |
| Radial Clearance d | 1.5 | 6.4 | 1.5 | 6.4 |
| Tube Int. $\phi$ $\phi_{ID} = \phi_w + 2d$ | 203.0 | 212.7 | 203.0 | 212.7 |
| Band Height b = a · c | 26.7 | 27.9 | 11.4 | 7.6 |
| Band Spacing c | 3.8 | 12.7 | 3.8 | 12.7 |
| Pitch a = l/n | 30.5 | 40.6 | 15.2 | 20.3 |
| Flat Zone l | 762 | 1016 | 762 | 1016 |
| No. of Wafers n | 25 | 25 | 50 | 50 |
| Wafer $\phi$ ($\phi_w$) | 200 | 200 | 200 | 200 |

TABLE 4

| Family 200 mm | Min., mm | Max., mm |
|---|---|---|
| Slot Width w | 5.1 | 19.1 |
| Radial Clearance d | 1.5 | 6.4 |
| Tube Int. $\phi$ $\phi_{ID} = \phi_w + 2d$ | 203.0 | 212.7 |
| Band Height b = a · c | 6.4 | .8 |
| Band Spacing c | 3.8 | 12.7 |
| Pitch a = l/n | 10.2 | 13.5 |
| Flat Zone l | 762 | 1016 |
| No. of Wafers n | 75 | 75 |
| Wafer $\phi$ ($\phi_w$) | 200 | 200 |

TABLE 5

| Family 300 mm | Min., mm | Max., mm | Min., mm | Max., mm |
|---|---|---|---|---|
| Slot Width w | 5.1 | 19.1 | 5.1 | 19.1 |
| Radial Clearance d | 1.5 | 6.4 | 1.5 | 6.4 |
| Tube Int. $\phi$ $\phi_{ID} = \phi_w + 2d$ | 302.8 | 312.7 | 302.8 | 312.7 |
| Band Height b = a · c | 59.7 | 93.1 | 27.9 | 40.2 |
| Band Spacing c | 3.8 | 12.7 | 3.8 | 12.7 |
| Pitch a = l/n | 63.5 | 105.8 | 31.8 | 52.9 |
| Flat Zone l | 762 | 1270 | 762 | 1270 |
| No. of Wafers n | 12 | 12 | 24 | 24 |
| Wafer $\phi$ ($\phi_w$) | 300 | 300 | 300 | 300 |

TABLE 6

| Family 300 mm | Min., mm | Max., mm | Min., mm | Max., mm |
|---|---|---|---|---|
| Slot Width w | 5.1 | 19.1 | 5.1 | 19.1 |
| Radial Clearance d | 1.5 | 6.4 | 1.5 | 6.4 |
| Tube Int. $\phi$ $\phi_{ID} = \phi_w + 2d$ | 302.8 | 312.7 | 302.8 | 312.7 |
| Band Height b = a · c | 17.3 | 22.6 | 12.1 | 13.8 |
| Band Spacing c | 3.8 | 12.7 | 3.8 | 12.7 |
| Pitch a = l/n | 21.2 | 35.3 | 15.9 | 26.5 |
| Flat Zone l | 762 | 1270 | 762 | 1270 |
| No. of Wafers n | 36 | 36 | 48 | 48 |
| Wafer $\phi$ ($\phi_w$) | 300 | 300 | 300 | 300 |

The heat shields are selected from material such as metal, crystal, ceramic, graphite or composites of any of the above. Components made of quartz, polysilicon, silicon carbide, alumina or silica are preferred. Quartz forms with different opacities such as sandblasted, opaque and clear fused quartz can be used. The heat shield material must have dimensional and structural stability at the maximum heat treatment temperatures, the purity and inertness to prevent contamination of the materials being processed, and the opacity to shield the wafer surface from a portion of the infrared radiant heat emitted by the heat sources surrounding the wafer boat. The process of this invention heat treats multiple wafers positioned in a mutually parallel orientation in a heating zone surrounded by a heater emitting radiant heat. The process comprises shielding the outer portions of each wafer from radiant heat emitted by the heater with the wafer boat assembly described above.

In the optimum process, the heat provided by the heater is sufficient to raise the temperature of the wafers from 21° C. up to 1100° C. at a rate of from 50° C./min to 100° C./min without causing mechanical damage due to induced thermal stresses in the wafers.

FIG. 8 is a front view of the wafer boat of FIG. 3 showing the wafer loading effector slot. The slot 48 through the length of the cylinder wall in a direction parallel to the central axis of the cylinder is provided for the vertical passage of the wafer loading effector device and is placed in the approximate center of slots 39. The wafer loading effector slot 48 can have a width, "w", of from 5 to 20 mm. Values for "w" are provided above in Tables 1, 2, 3, 4, 5 and 6.

FIG. 9 is a top view of the wafer boat of FIG. 3 showing a preferred relative placement of the effector loading slot and the wafer support tabs. The forward support tabs 70 and 72 are positioned symmetrically in the front half of the shield band 34. The rear support tabs 74 and 76 are positioned symmetrically in the rear half of the shield band 34, preferably more closely than the distance between tabs 70 and 72.

FIG. 10 is an isometric view of the wafer boat of FIG. 3 in combination with a wafer loading effector 78. The effector has a connector 80 shaped for mounting to an arm of a conventional computer controlled robot (not shown), an arm 82 which is sufficiently thin or narrow to pass through the slot 48 in the bands 40 and a wafer support platform 84. Movement of the effector 78 during loading and unloading wafers is shown hereinbelow with respect to FIGS. 18–20.

FIG. 11 is a side view of the wafer boat of FIG. 10 showing the wafer loading effector 78 in side view, positioned at an intermediate position in the section of wafer boat.

FIG. 12 is an isometric view of the wafer loading effector 78, and FIG. 13 is a top view thereof. The connector 80 at the distal end connects to the arm 82. Arm 82 has a thin width and comprises two slender extensions 86 and 88 separated by a space 90. When machined from a solid blank or casting, material is removed to provide the space 90 to fit fiber optic vision systems and vacuum wafer attachment passages (not shown). The distal end of the arm 82 is connected to the wafer support platform 84. The upper support surface of the platform 84 has material removed to leave raised surfaces 92 for contacting the wafer and reduce heat absorption during unloading and to promote heat loss between loadings.

FIG. 14 is a cross-sectional view of the wafer loading effector 78 of FIG. 13, taken along the line A—A, and FIG. 15 is an end view of the wafer loading effector of FIG. 12 as seen from the wafer support end of the device. The arm 82 is connected to the wafer support platform 84 by a web 94. Both the web 94 and the support platform 84 have holes or similar passages 96 therethrough to facilitate wafer attachment vacuum and fiber optic vision systems.

FIG. 16 is a side view of the wafer loading effector of FIG. 12, and FIG. 17 is an end view of the wafer loading effector of FIG. 12 as seen from the connector end. The arm 82 is tapered 98 from the connector end to the wafer support end to reduce weight and control heat transfer and cooling from the wafer support platform 84.

The effector 78 is used to load a succession of wafers into their respective supports in the wafer boat. FIGS. 18, 19 and 20 are respective side views of a wafer loaded effector approaching a wafer boat prior to unloading the wafer, after movement into position in a wafer boat prior to depositing the wafer, and as the effector is being withdrawn after wafer the wafer is deposited in the wafer boat. In FIG. 18, the effector approaches the wafer boat with a wafer 100 supported on the wafer support 84 positioned to pass through the slot opening 102. In FIG. 19, the effector 84 and wafer 100 have passed through slot 102, and the wafer 100 is positioned immediately above the wafer supports 44. The effector 84 is lowered down slot 48 (FIG. 10), depositing the wafer 100 onto the supports 44. The effector 84 is then lowered into alignment with the slot 104 for exit from the system. In FIG. 20, the wafer support 84 has been removed from the wafer boat, leaving the wafer 100 in place. This process is repeated to deposit the next wafer until the wafer boat is completely loaded. The wafer boat is then lifted into the furnace for treatment of the wafers according to this invention. Following the treatment and cooling of the system, the wafer boat is lowered from the furnace, and the effector 78 removes the wafers, one-by-one by a process exactly reversed from the steps described above, entering a slot below the wafer, lifting the wafer and removing it through the slot immediately above. This system also provides "Pick and Place" capability to insert and remove wafers from any location in the boat, with or without moving wafers immediately above or below.

Figure 21:
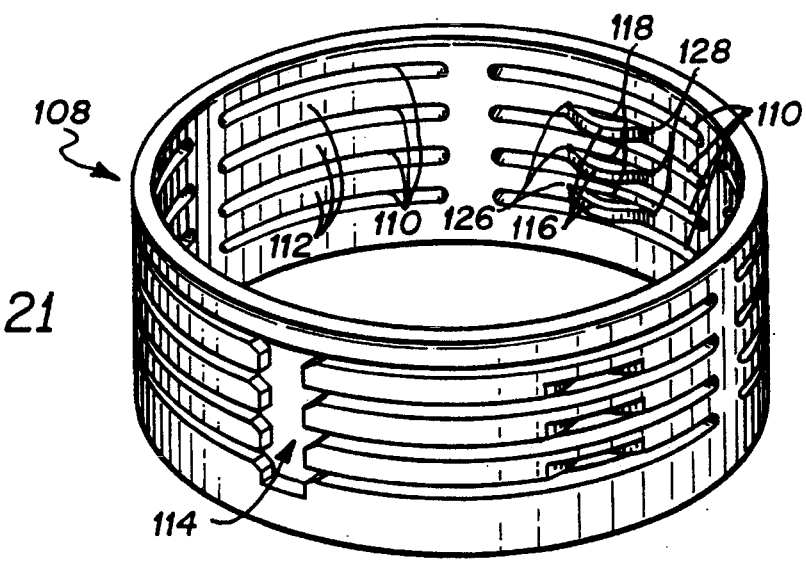
FIG. 21 is an isometric view of a preferred wafer boat of this invention.
Figure 22:
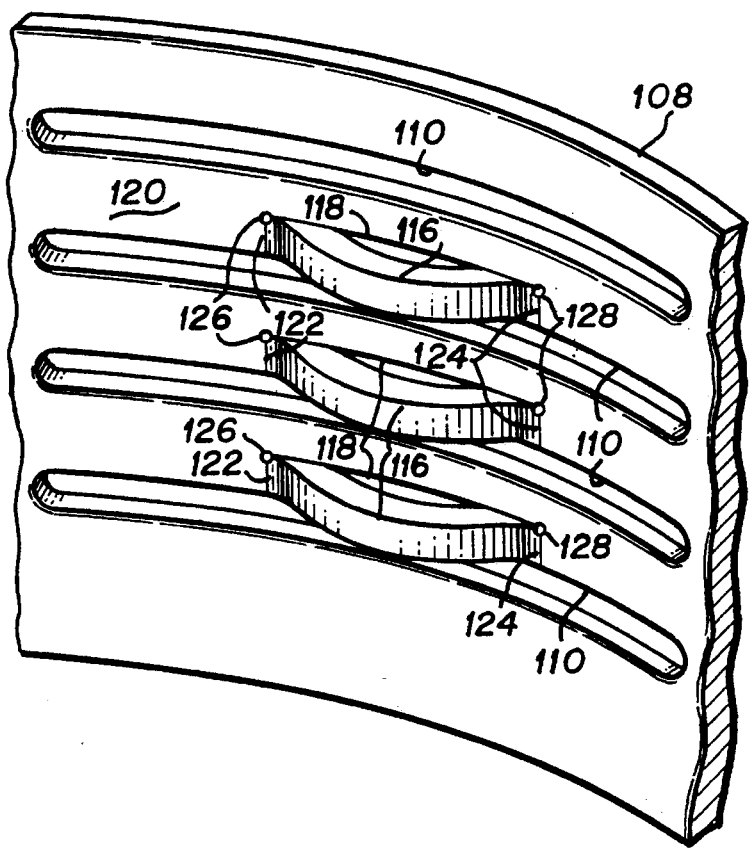
FIG. 22 is a fragmentary, isometric view of the wafer support construction of the wafer boat of FIG. 21.

FIG. 21 is an isometric view of a preferred wafer boat 108 of this invention, and FIG. 22 is a fragmentary, isometric view of the wafer support construction of the wafer boat of FIG. 21. The cylinder is similar to the wafer boat shown in FIG. 3 in having a plurality of wafer slots 110, the upper and lower edges of which define the wafer protecting bands 112 and an effector or wafer loading slot 114. In this embodiment, the wafer supports are inwardly extending strips 116. The upper edge 118 of each projection is formed by a single cut through the respective band 120 in a plane substantially perpendicular to said cylinder axis with the ends 122 and 124 of the strip being integral with the band. Circular stress relief holes 126 and 128 are placed at the ends of each cut to eliminate the cuts as an origin of stress relief cracks during the heating and cooling to which the wafer boat is exposed.

It will be readily apparent to a person skilled in the art that numerous modifications and variations of the present invention are possible in light of the above teachings. It is therefore to be understood that within the scope of the appended claims, the invention may be practiced otherwise than as specifically described herein.

The invention claimed is:

1. A thermal treatment boat comprising a cylinder having a central axis and a plurality of sets of one or more band slots having opposed upper and lower surfaces in planes perpendicular to said central axis and spaced at predetermined locations along said central axis, at least one slot in each plane extending around at least 180° and less than of the full circumference of said cylinder, pairs of adjacent band slots defining an annular band therebetween, the height of each slot being from about 3.8 to 12.7 mm, each of the bands having a height, Height$_{Band}$, in mm, according to the equation:

$$\text{Height}_{Band} = \frac{\text{ColumnHeight} - \Sigma\text{BandSlotHeight}}{\text{NumberBands}}$$

wherein Height$_{Band}$ always ≧ wafer thickness; ColumnHeight is the total height of the cylinder, mm; BandSlotHeight is the height of the slot, mm; and NumberBands is the total number of bands in the treatment boat.

2. A thermal treatment boat of claim 1 comprising a plurality of slots in each plane.

3. A thermal treatment boat of claim 2 wherein the cylinder includes a wafer loading effector slot therethrough in a plane of the central axis extending along the length of the cylinder, the wafer loading effector slot having a width of from 5 to 20 mm.

4. A thermal treatment boat according to claim 1 wherein NumberBands is from about 12 to about 100, provided that Height$_{Band}$ is at least greater than or equal to the wafer thickness.

5. A thermal treatment boat according to claim 1 wherein each band includes wafer support means for supporting a wafer therein at a position which is substantially centered between the upper edge surface and said lower edge surface thereof.

6. A thermal treatment boat of claim 5 wherein each wafer support means includes at least three inwardly extending projections having coplanar upper surfaces.

7. A thermal treatment boat of claim 6 wherein the inwardly extending projections are inwardly extending strips, the upper edge of each projection having been formed by a cut through the respective band in a plane substantially perpendicular to said cylinder axis.

8. A thermal treatment boat of claim 7 wherein an inwardly extending strip is an inwardly depressed strip formed by a single cut through the band with both ends of the strip integral with the band.

9. A thermal treatment boat of claim 7 wherein an inwardly extending strip is a tab formed by a plurality of tab-defining cuts extending through the cylinder wall.

10. A thermal treatment boat of claim 5 wherein each band has an inner surface, and each band and wafer support means defines a wafer occupancy zone corresponding to the volume to be occupied by a wafer for which it is sized, the radial clearance between the outer edge of the wafer occupancy zone and the inner surface of the respective band being within the range of from about 1.5 to 6.3 mm.

11. A thermal treatment boat of claim 5 wherein each band and wafer support means defines a wafer occupancy zone corresponding to the volume to be occupied by a wafer for which it is sized and the outer diameter of the wafer occupancy zone is about 150 mm, and the NumberBands is from about 25 to 100.

12. A thermal treatment boat of claim 5 wherein each band and wafer support means defines a wafer occupancy zone corresponding to the volume to be occupied by a wafer for which it is sized, the outer diameter of the wafer occupancy zone is about 200 mm, and the Number$_{Bands}$ is from about 25 to 75.

13. A thermal treatment boat of claim 5 wherein each band and wafer support means defines a wafer occupancy zone corresponding to the volume to be occupied by a wafer for which it is sized, the outer diameter of the wafer occupancy zone is about 300 mm, and the NumberBands is from about 12 to 48.

14. A thermal treatment boat of claim 1 wherein each band is an incomplete circle, the opposed ends thereof defining a slot having a height of from 5 to 20 mm.

15. A thermal treatment boat of claim 1 having components made of metal, crystal, ceramic, graphite or a composite thereof.

16. A thermal treatment boat of claim 15 wherein the components are made of quartz, polysilicon, silicon carbide or silica.

17. A thermal treatment boat of claim 1 wherein in each boat, the height of each band and the band spacing between adjacent bands are substantially the same.

18. A process for heat treating multiple wafers positioned in a common vertical axis and positioned in a mutually parallel orientation in a heating zone surrounded by a heater emitting radiant heat, the improvement comprising shielding the outer portions of each wafer from radiant heat emitted by the heater with a annular heat band positioned between the outer edge of each wafer and the heater, each annular heat band being one of a plurality of heat bands formed in a cylinder having a central axis and a plurality of sets of one or more band slots having opposed upper and lower surfaces in planes perpendicular to said central axis and spaced at predetermined locations along the central axis, at least one band slot in each set extending around at least 180° and less than the full circumference of said cylinder, adjacent band slots defining an annular band therebetween, the height of each slot being from about 3.8 to 12.7 mm, each of the bands having a height, Height$_{band}$, in mm, according to the equation:

$$\text{Height}_{Band} = \frac{\text{ColumnHeight} - \Sigma\text{BandSlotHeight}}{\text{NumberBands}}$$

wherein Height$_{Band}$ is always ≧ wafer thickness; ColumnHeight is the total height of the cylinder, mm; BandSlotHeight is the height of the slot, mm; and NumberBands is the total number of bands in the treatment boat.

19. A process of claim 18 wherein the distance between the edge of each wafer and the band by which it is shielded is from 1.5 to 6.3 mm.

20. A process of claim 18 wherein the heat provided by the heater is sufficient to raise the temperature of the wafers from 21° C. up to 1100° C. at a rate of from 50° C./min to 100° C./min without causing mechanical damage due to thermal stresses to the wafers.

* * * * *